(12) United States Patent
Conboy et al.

(10) Patent No.: US 6,699,004 B1
(45) Date of Patent: Mar. 2, 2004

(54) WAFER ROTATION IN WAFER HANDLING DEVICES

(75) Inventors: Michael R. Conboy, Austin, TX (US); Russel Shirley, Pflugerville, TX (US); Elfido Coss, Jr., Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 124 days.

(21) Appl. No.: 09/520,591

(22) Filed: Mar. 8, 2000

(51) Int. Cl.[7] .................................................. B25J 3/00
(52) U.S. Cl. ........................................ 414/757; 414/936
(58) Field of Search ................................. 414/936, 935, 414/941, 757; 198/395

(56) References Cited

U.S. PATENT DOCUMENTS

| | | | | |
|---|---|---|---|---|
| 4,836,733 A | * | 6/1989 | Hertel et al. ................ | 414/936 |
| 5,511,934 A | * | 4/1996 | Bacchi et al. ................ | 414/936 |
| 5,513,948 A | * | 5/1996 | Bacchi et al. ................ | 414/936 |
| 5,673,208 A | * | 9/1997 | Meier et al. ................. | 414/936 |
| 5,842,825 A | * | 12/1998 | Brooks ........................ | 414/936 |
| 6,180,424 B1 | * | 1/2001 | Tigelaar et al. .............. | 414/936 |
| 6,203,582 B1 | * | 3/2001 | Berner et al. ................ | 414/941 |

* cited by examiner

Primary Examiner—Kenneth W. Noland

(57) ABSTRACT

Tracking the movement of individual wafers in a semiconductor processing system is improved by using an apparatus to axially rotate a wafer and using both the rotation angle and the wafer's location in the processing system as tracking coordinates. In an example embodiment, the apparatus imparts angles of rotation on the wafers in different stages of wafer processing. The rotation angles of each wafer are collected as data along with the wafer's location in the process. The combined wafer location and angle of rotation data are used to map the path the wafer has traveled from the onset of processing. An important advantage to this apparatus is the increased control and improved yields that the apparatus brings to wafer processing.

10 Claims, 5 Drawing Sheets

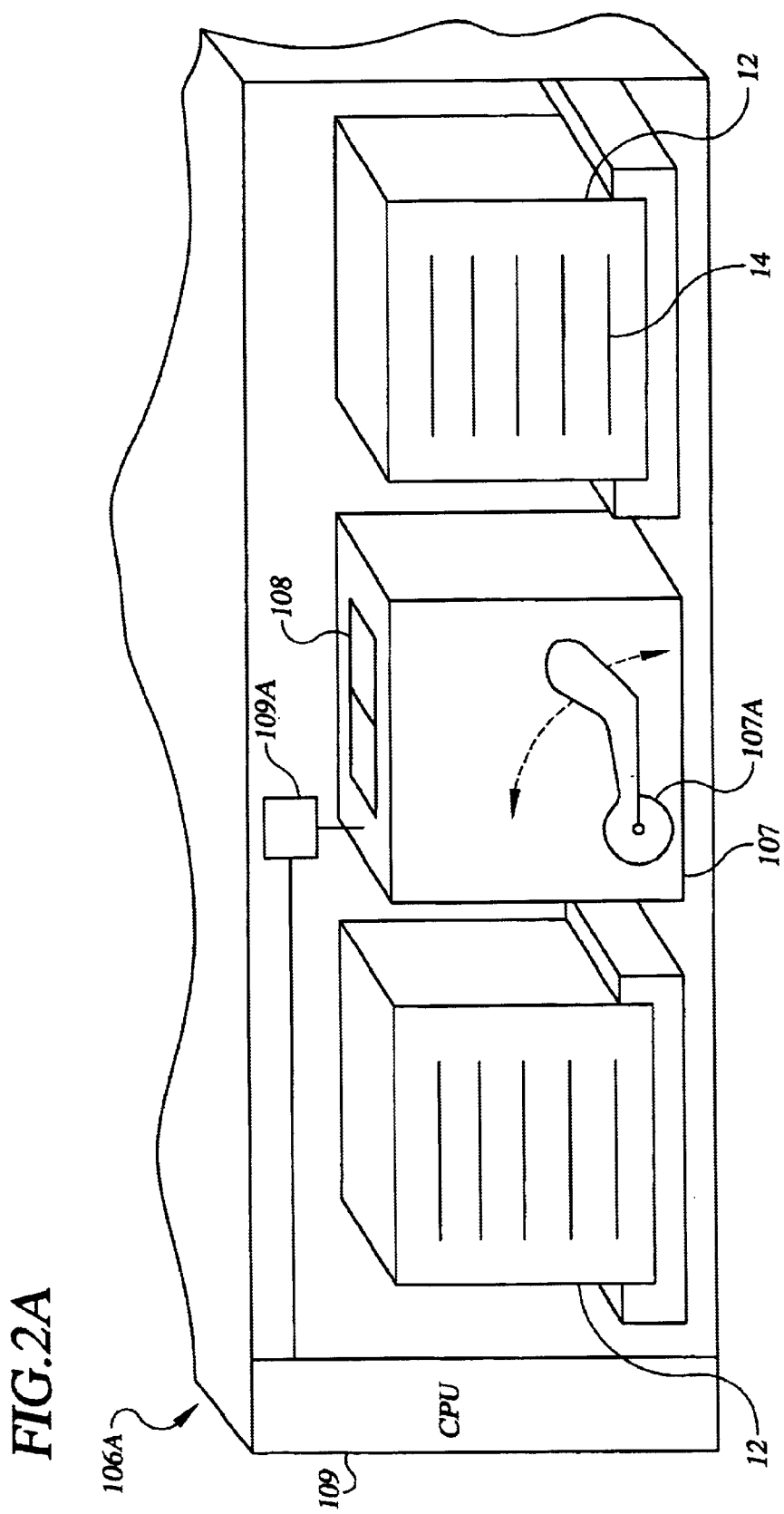

WAFER ROTATION IN WAFER HANDLING DEVICES

FIELD OF THE INVENTION

The present invention generally relates to processing of material in a manufacturing plant and, more particularly, to apparatus and systems for rotating and tracking the movement of wafers in a semiconductor processing plant.

BACKGROUND OF THE INVENTION

Conventional manufacturing plants move material to be processed through a manufacturing process having several processing areas. Currently these material lots are tracked in larger quantities that may be disposed in a carrier for ease of movement throughout the facility.

Some manufacturing processes require that the item being processed be rotated regularly in order to ensure that the item is properly processed, such as when painting an object or when applying a coating to a substrate. In the case of a mechanical process, the object is rotated to ensure that the tooling is being worn evenly or that the tooling is mechanically treating the object evenly. Even though some of these items may be individually processed, or processed in small lots, the items may form part of a larger lot being manufactured and it is difficult to distinguish the progress of the individual item as it moves through the processing line. As the number of processing steps increase tracking becomes even more difficult. This is particularly a problem in the processing of wafers in a semiconductor processing plant.

A conventional semiconductor fabrication plant typically includes multiple fabrication areas or bays interconnected by a path, such as a conveyor belt. Each bay generally includes the requisite fabrication tools (interconnected by a subpath) to process semiconductor wafers for a particular purpose, such as photolithography, chemical-mechanical polishing or chemical vapor deposition, for example. Material stockers or stocking tools generally lie about the plant and store semiconductor wafers waiting to be processed. Each material stocker typically services two or more bays and can hold hundreds of cassettes. The wafers are usually stored in cassettes in groups of about 25 wafers. The wafers are then disposed within a carrier and move from one process step to another in the carrier. The carriers are usually tracked by their carrier code by a computer system as they move through the plant.

Once a lot has been retrieved, and the equipment has been set up, the operation on the wafers by a particular piece of equipment, or "tool," can begin. At this point, the lot is "moved-in" to the operation. An operator on the line then communicates this information to the host computer. The lot remains in this state until the operation is completed. Once the operation is completed, the operator must perform tests and verifications on the wafers. When all tests and verifications have been performed, the host computer application program must be notified. Wafers may have moved from one cassette to another as a result of the operation; therefore the host application and computer have to be notified of these moves. The operator then places the cassette of "moved-out" wafers in the material stocker to await orders as to the location of the next piece of equipment that will perform operations on the wafers.

The semiconductor fabrication plant, including the bays, material stockers and the interconnecting path, typically operates under control of a distributed computer system running a factory management program. In this environment, the automated material handling system (AMHS) may conceptually include the cassettes, the transportation system (e.g., paths) and control system (e.g., the distributed computer system). An empty carriers management system as well as a separate test wafer management system may also form part of the AMHS.

Data gathered during the course of wafer processing is used to diagnose yield problems and forms the basis of yield improvement efforts. Such data includes parametric electrical test data gathered on individual circuits and test structures fabricated on the wafers, as well as wafer sort data which tests the suitability for use of the wafers once wafer processing is completed. One of the possible sources of yield variation is the order in which wafers in a lot are processed at a given processing step. When the processing is done one wafer at a time per step, a variation in yield may occur due to a build up of contaminants, uneven heating of a processing chamber or another physical effect that changes during the processing of the lot. In a batch operation, the physical location of the wafer in the batch processing equipment may influence uniformity of the processing effects across the lot. In an example where wafers are moving through a contaminated chamber, if the order in which each wafer is processed is known then the final wafer yield may be plotted against the processing order in this step. For each wafer in a lot a drop-off in yield versus processing order would be observed due to the contamination problem. This data is used to make adjustments to the line to improve yield; however, this wafer tracking method lacks the level of precision in the data collected required by chip plants today.

In tracking the wafer processing order, specialized equipment has been used to read scribed wafer identifiers, either immediately prior to or after critical processing steps, and to store this data for later correlation with device performance. Randomizing the order of the wafers prior to such steps is often done to ensure effects are not compounded. The wafer positional data is fed into a computer system, the device performance metrics for a wafer lot of interest are manually entered, and then all possible graphs of the device metrics for that lot versus wafer processing order at each step are generated. The data is then reviewed to determine those steps at which the processing order may affect performance. This type of approach to tracking wafers can be costly in its implementation due to the amount of hardware and software needed to randomize the wafer order and interface with the wafer processing system's main computer database.

SUMMARY OF THE INVENTION

The present invention is directed to addressing the above and other needs in connection with improving wear rates of tooling and equipment in a semiconductor processing line and improving traceability of product as it moves through the manufacturing process. In the case of multiple stage wafer processing, once the wafer is presented at the start of processing the opportunity to track the individual wafer and its progress is no longer available. In view of the above, there is a need for a wafer rotation apparatus that has a high level of tracking precision as an individual wafer is moving from one processing stage to another. There is also a need to implement a wafer rotation apparatus that provides a feedback component for making adjustments on the wafer processing line or in the wafer rotation apparatus.

According to one aspect of the invention, it has been discovered that by rotating a wafer and recording the rotation angle data and the wafer's location it is possible to track the wafer more accurately. It has also been discovered that tooling wear can be more controlled if the wafer being process is rotated prior to processing. Accordingly, an apparatus that rotates a wafer in a multiple stage wafer processing system includes a scanning device for determining an incoming angle of rotation on a wafer at a first stage of wafer processing. A rotating device rotates the wafer to an outgoing angle of rotation as the wafer is exiting the first stage and before moving the wafer into a second stage of wafer processing. A computer arrangement records the angle of rotation and a corresponding wafer location in the wafer processing system as the wafer moves through each stage of the processing system.

According to another aspect of the invention, an apparatus that rotates wafers in a wafer processing system includes a rotating device that imparts an incoming angle of rotation as the wafer is presented to a first stage of wafer processing. A scanning device is also included that is adapted to determine angles of rotation as the wafer is moving through the first stage and a second stage of wafer processing. As part of the apparatus, a computer arrangement is included for recording the angle of rotation of the wafer and a corresponding wafer location as the wafer moves through the first and second stages of wafer processing.

In yet another aspect of the invention, a system for rotating and tracking wafers in a wafer processing system includes a sorting apparatus that identifies a wafer and places the wafer in a carrier slot. A rotating apparatus rotates the wafer to an incoming angle of rotation as the wafer is presented to a first processing stage of wafer processing. A computer arrangement is adapted to record and track as data the angle of rotation and the corresponding location of the wafer in the wafer processing system as the wafer moves through separate stages of wafer processing. Along with the wafer identification code, an individual wafer historical movement map is developed from the rotation angles and the wafer locations that were recorded in connection with the each stage of wafer processing.

In yet another aspect of the invention, an apparatus for rotating wafers in a multiple stage wafer processing system includes a rotating device that rotates a wafer to an incoming angle of rotation as the wafer is presented to a first stage of wafer processing. A scanning device is included that is adapted to determine angles of rotation as the wafer is moving through the first stage and a second stage of wafer processing. A computer arrangement is also included for recording the angle of rotation of the wafer and a corresponding wafer location as the wafer moves through the first and second stages of wafer processing. The rotating device is also adapted to rotate the wafer to an outgoing angle of rotation as the wafer moves from the first stage into the second stage of wafer processing The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 2A is an apparatus for rotating and tracking wafers in a processing system in accordance with one embodiment of the invention;

Figure 1B:
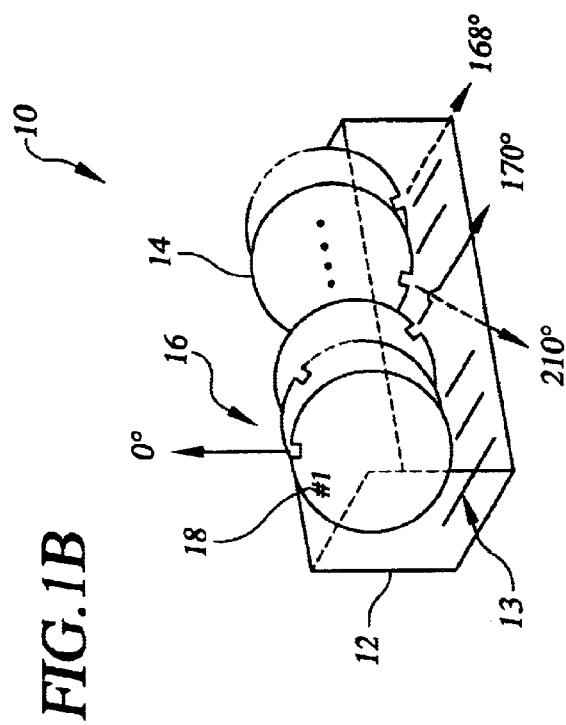
FIG. 1B is a carrier having a set of wafers arranged in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to an apparatus and system for rotating and tracking an object in a manufacturing process. The invention is particularly suited for rotating wafers and tracking their movement as they progress through a wafer processing system. While the present invention is not necessarily limited to a wafer processing application, the invention will be better appreciated using a discussion of exemplary embodiments in such a specific context.

In an example embodiment, an apparatus for rotating wafers in a wafer processing system includes a rotating device that first rotates the wafer to an angle of rotation during wafer processing. A computer arrangement records each angle of rotation of the wafer and records the corresponding wafer location in the processing system as the wafer moves through the system. The angles of rotation on a particular wafer are collected as data along with the tool/equipment identification code and the wafer's location on the line. Each set of movement data will serve as coordinates that can be used to track the movement of the wafer from the onset of processing or can be used to develop a historical wafer movement map of each wafer that moves through the line.

Figure 1A:
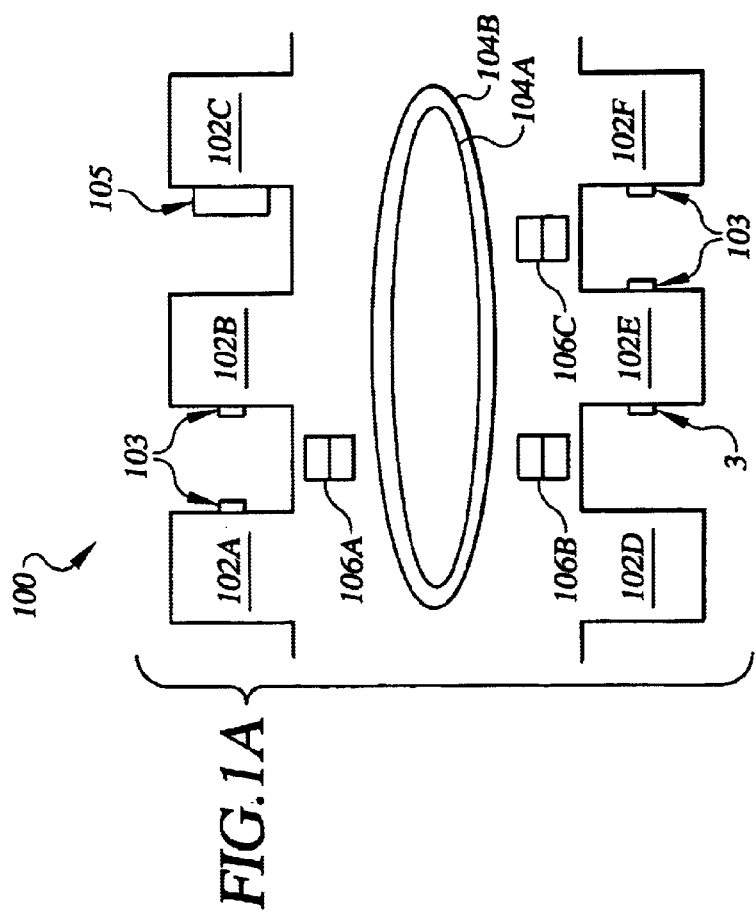
FIG. 1A is a physical layout of a shop floor arranged in accordance with one embodiment of the invention.

Referring now to the figures, FIG. 1A illustrates a physical layout of a shop floor 100 that includes an apparatus for rotating wafers in accordance with one embodiment of the present invention. Bays 102–102F include tools and equipment 103 that are used for processing the wafers that move from one bay to another via conveyor systems 104A and 104B. In one example, the conveyor systems include a material handling system or in its simplest form a pick and place device. Area 105 indicates a photolithography area where the wafers are presented but are excluded from being rotated since the photolithography process requires that all of the wafers go in with the same orientation. Apparatus 106A–106C are located near the bays and they deliver the wafer lot to the different stages in the processing line. Each apparatus is capable of sorting, rotating and presenting each wafer to the processing stage at a particular location.

FIG. 1B illustrates a wafer lot 10 arranged in a carrier 12 in accordance with one embodiment of the invention. Carrier 12 has a series of slots 13 that hold individual wafers 14 therein for movement through the wafer processing system. Wafers 14 have a slot or notch 16 located along the circumference that serves as a point of reference. In this example, slot 16 is at 0 degrees and serves as the starting point from which the wafer is rotated axially to give the wafer an angle of rotation. The wafers are rotated to different angles of rotation and the increment of rotation is either predetermined or varies randomly. In the application where the wafers are rotated randomly, each wafer is to have a distinct angle of rotation before moving through the process. In a related application, the wafers have the same initial angle of rotation at the onset of the wafer processing. In another application, each wafer can have about 360 angles of rotation, of 1-degree increments, excluding the slot portion and the scribe portion.

In other manufacturing applications, it is important to identify the axis of rotation of the object and the starting or reference point from which the angle of rotation will be measured. For example, where the object is a thin film display panel, the axis of rotation is similar to that of a wafer in that the panel is flat and acts as a substrate while its being processed. In one instance, the panel has about 4 main angles of rotation due to the panel's square shape.

Where the wafers are to be subjected to common process steps, such as heating in a furnace, the wafers are usually arranged in tubes. Since many tubes include up to 100 wafers, in this example each set of wafers is to have a distinct angle of rotation with respect to the adjacent wafer set. In a related example, each wafer has a distinct angle of rotation with respect to all of the wafers in the tube. Referring briefly to FIG. 1B, each wafer also has a scribe or a code 18 located on the wafer for identifying the wafer. In addition, each carrier and cassette in the wafer processing system is also identified and tracked by an identification tag, such as a bar code, which is read by a sensor along the processing path.

Referring now to FIG. 2A (and FIG. 1B), rotating apparatus 106A is described in more detail and is an example of the type of rotating apparatus that is placed in different locations along the processing line. In particular, apparatus 106A includes a rotating device 107, a scanning device 108 and a computer arrangement 109. In this example, the components are co-located in a single enclosure or are simply in close proximity with each other. Adjacent the rotating device 107 are located carriers 12 having wafers 14 located therein. In operation, rotating device 107 has a pick and place arm or paddle 107A that moves the wafers from carriers 12 into the process. Placing the wafer into the process includes placing the wafer in a chamber and then rotating the wafer to a given angle of rotation. Scanning device 108 then reads the rotation angle and the wafer I.D. code and determines the wafer location in the process. The data is transmitted to computer 109 via a transmitting line or device 109A and it is recorded.

The rotating device imparts angles of rotation to the wafer that include an incoming angle, a translation angle and an outgoing angle. Scanning device 108 is adapted to read any of these angles. Apparatus 106A also includes a wafer sorter that scans and sorts the wafers and identifies the wafer and the slot location. The sorter also includes a robotic arm for imparting a predetermined or random angle of rotation on the wafer. The sorter is coupled to computer 109 so as to receive wafer data as the sorter is scanning the wafers.

Figure 2B:
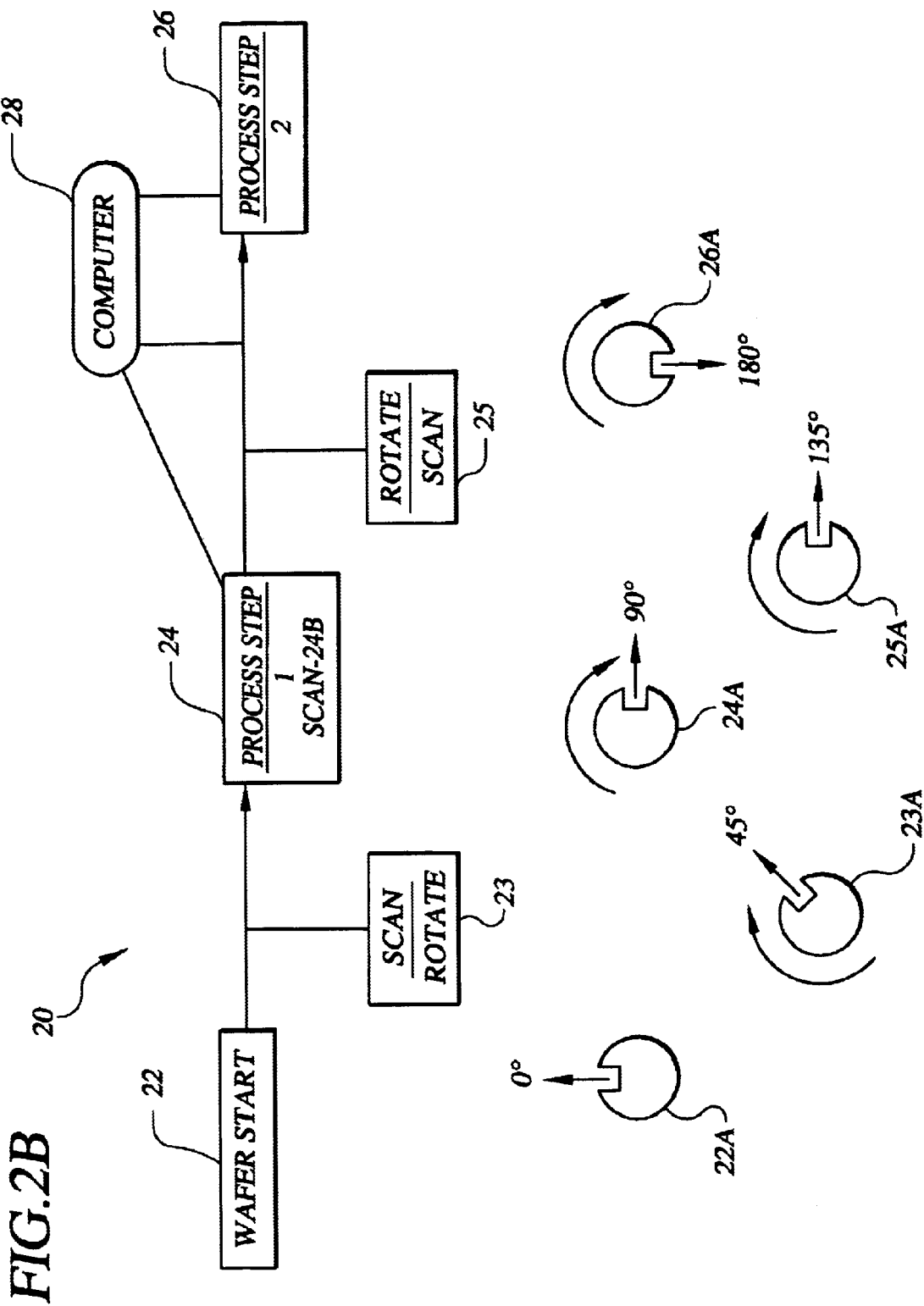
FIG. 2B is a process flow diagram of an example wafer process line and the angles that the wafer is rotated to as the wafer moves through the process in accordance with one embodiment of the invention.

Referring now to FIG. 2B, a process flow diagram exemplifies a wafer processing line 20 that has a computer arrangement coupled thereto. FIG. 2B also illustrates a wafer having different angles of rotation as it moves through the wafer process. The different angles of rotation correspond to the various steps of the process. At location 22, the wafer lot is started and wafer 22A has an initial angle of rotation of 0 degrees. The wafer is also identified at this point by its code and slot position in the carrier and this information is recorded in a computer arrangement 28. The movement of the wafer is tracked with this information and the successive angles of rotation are used to create a historical map of the movement of the wafer through the process.

In another embodiment, it is advantageous to impart an initial angle of rotation at 22A, either randomly or a predetermined angle. The wafer is rotated by a rotating apparatus, such as apparatus 106A, to an angle of 45 degrees as shown by wafer 23A. Wafer 23A is now scanned for the identification code by scanner 108 of apparatus 106A. The data that is generated after the scanning of the wafers is then recorded in computer 28 (having database capabilities) that is coupled at different points to the wafer processing line 20. Wafer 23A has an incoming angle of 45 degrees as it proceeds into the processing stage at location 24. A translation angle is added to the wafer due to the pick and place action (by a robotic arm, for example) that occurs as the wafer is removed from the carrier and is placed in the processing stage at location 24, resulting in wafer 24A. After adding the translation angle, the wafer has an angle of rotation of 90 degrees. The wafer is scanned at location 24B and the rotation angle is recorded in the computer database. Wafer 24A exits the processing stage at location 24 and is again rotated another 45 degrees at location 25 that results in wafer 25A with an angle of rotation of 135 degrees. This new angle is scanned and recorded at computer 28 as the outgoing angle of the processing stage. In the second processing stage at location 26 the wafer is given another rotation of translation, resulting in wafer 26A rotated to a cumulative 180 degrees.

Figure 3:
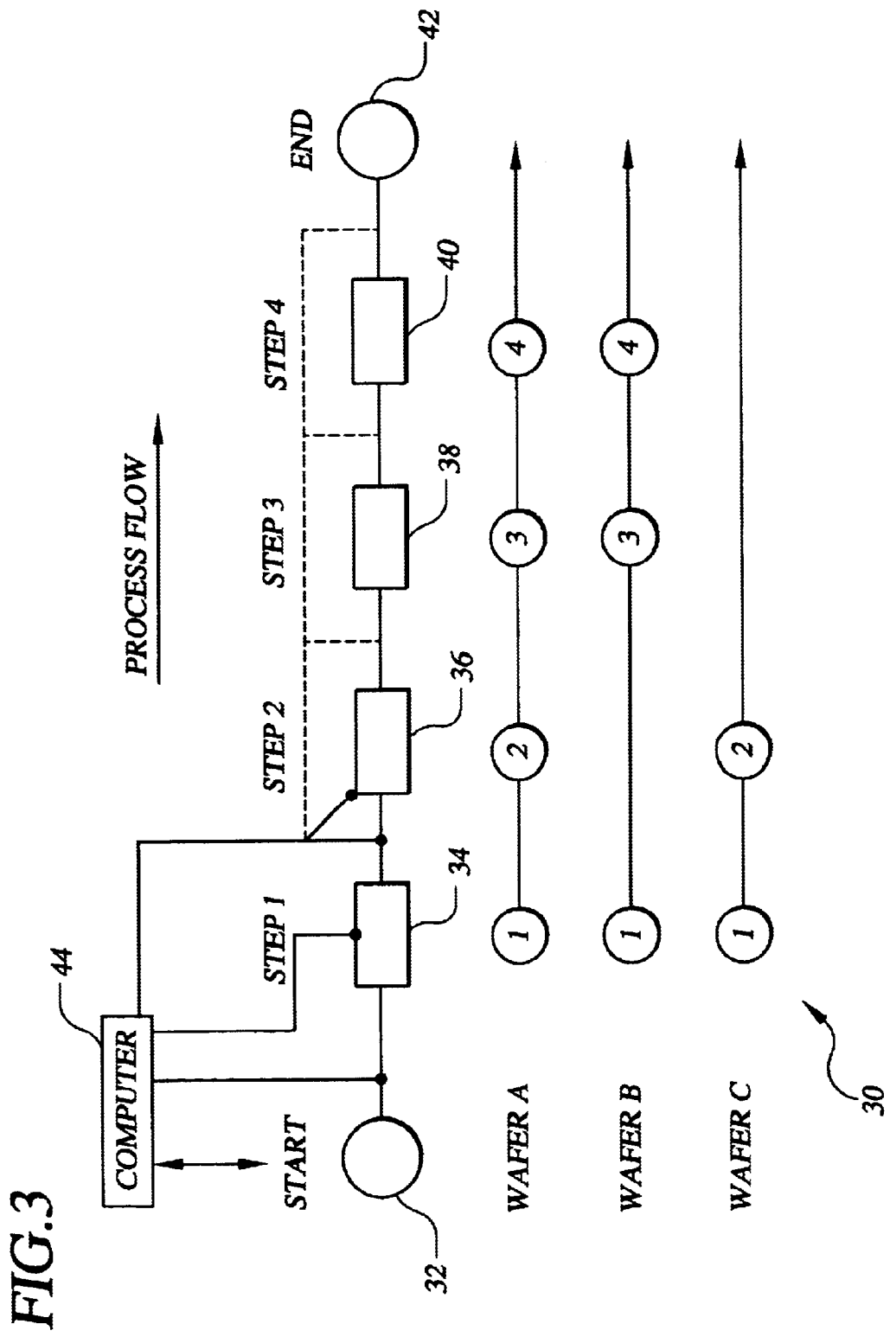
FIG. 3 is a process flow diagram of an example wafer process line and the three wafers that move through different stages of the process in accordance with one embodiment of the invention.

Referring to FIG. 3, a process flow diagram of an example wafer processing line 30 is illustrated with three wafers (A–C) moving through the processing line. Wafer processing starts at 32 and proceeds through four processing stages 34, 36, 38 and 40 before coming to an end at location 42. A computer 44 is coupled to the processing line at about every point in the processing line in order to collect data on the movement of the wafers in the system. Wafer A moves through the processing line, as indicated by the numbers under the locations, and is moved through each stage of the processing line. In this example, angles of rotation are imparted upon every movement of wafer A through the processing line. The angle of rotation data is tied to the corresponding processing stage and tool and then this information is recorded in the computer.

FIG. 3 is also representative of processing three sets of wafers (or three wafer lots) through a processing line. Although each set of wafers is processed according to its own processing recipe, the group of wafers may have a common processing step, such as going through a furnace in a tube holding about 100 wafers. In one example, the wafers are arranged such that each set of wafers has a different angle of rotation with respect to the adjacent set of wafers. In another example, each wafer in the tube has a different angle of rotation that is distinct from any other wafer. The processing line includes a scanning device for verifying that the angle of rotation of the wafers are distinct from each other before proceeding through the line.

Wafers B and C also move through the processing stages but follow different routes due to the lot sizes and the types of processing recipes that are applied to the wafers. Wafer B is processed through processing stages at locations 34, 38 and 40. The angle of rotation data for wafer B differs from that of wafer C in that more angles of rotation are imparted due to the fact that more processing steps are involved. As a whole, the set of angles for wafer set B versus wafer set C is also different due to the different path taken during processing. In both cases, the angles of rotation are tied to the processing stage and tool; this data is then recorded in computer 44 in order to create the historical movement map of each wafer or wafer lot. Table 1 below is an example of a wafer movement map that is developed by using the wafer identification information, the angles of rotation and the wafer location as coordinates:

TABLE 1

Wafer A Movement Map
WAFER A     CARRIER 1     SLOT 1

| Step | Process Stage | Tool | Rotation Angle (degrees) | Processing Parameter |
|---|---|---|---|---|
| 1 | Start (22) | | 0 | |
| 2 | Scan/Rotate (23) | Sorter 1000 | 45 | Sorting |
| 3 | Stage (24) Scan (24B) | Rotation table 1000 Robot Arm 1000 | 90 | Deposition |
| 4 | Rotate/Scan (25) | Sorter 200 | 135 | |
| 5 | Stage 2 | Rotation table 200 | 180 | Etch |
| 6 | Stage 3 | Tool 300 | 190 | Deposition |
| 7 | Stage 4 | Tool 400 | 200 | CMP |

In a related embodiment, the second stage of processing at location 36 also represents a multiple chamber subsystem having a number of tools associated therewith and subprocesses that the wafer moves through. Additional angles of rotation that are imparted in the subsystem are recorded as part of the mapping process. In a related embodiment, one of the chambers includes a rotating table device that is used to create a balanced subprocess, such as wafer coating. The current invention integrates the rate of rotation into the calculations of the angles of rotation and records this data as well in the movement map of the wafer.

Figure 4:
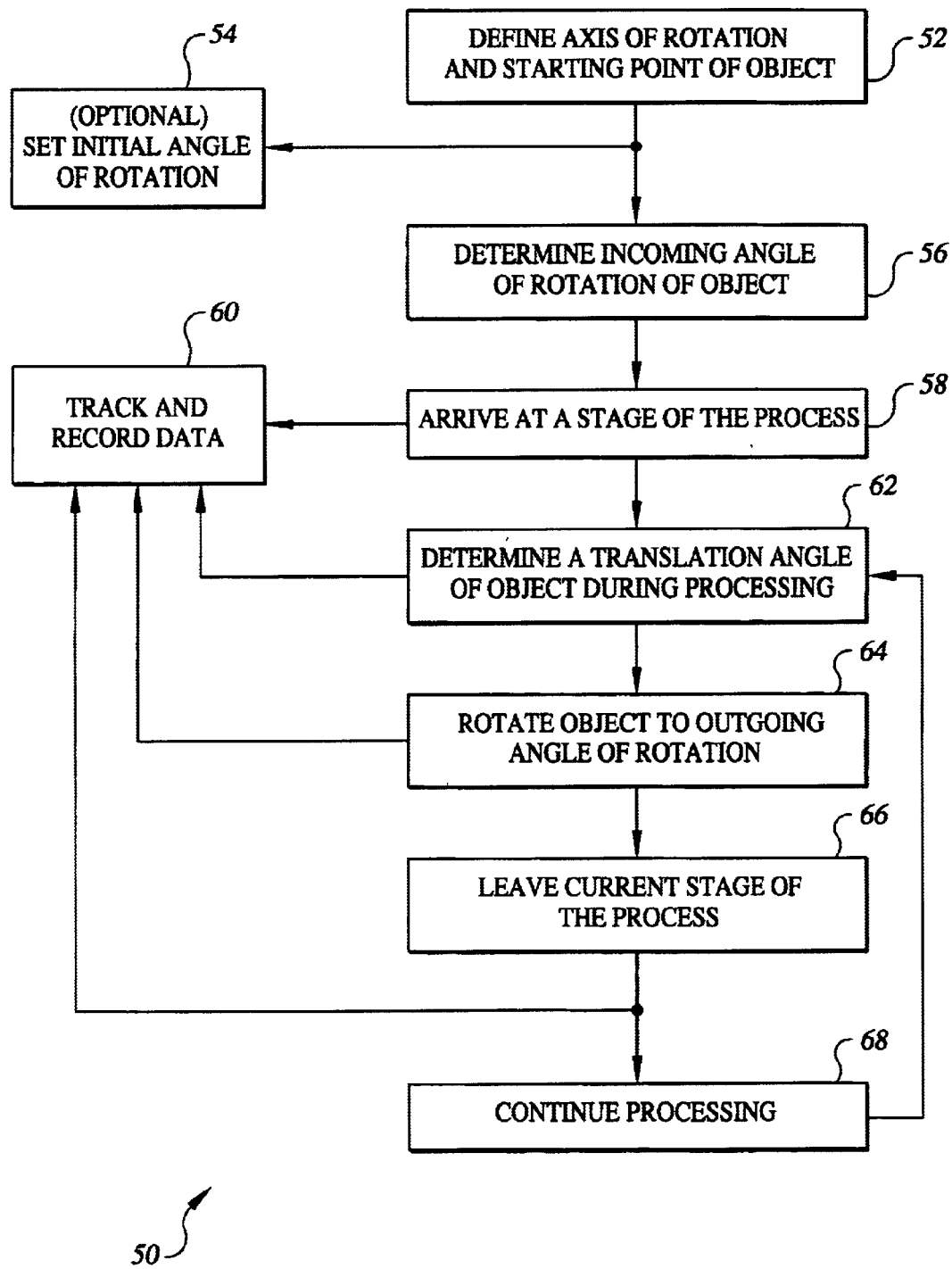
FIG. 4 is a flowchart of the manner in which objects are rotated and tracked in a manufacturing line in accordance with one embodiment of the invention.

Referring to FIG. 4, flowchart 50 illustrates an example of the flow of the method of rotating a wafer in accordance with an embodiment of the present invention. At 52, the axis of rotation of the wafer is defined as well as the starting point on the wafer for measuring the subsequent angles of rotation. At 54, an optional step in processing includes imparting an initial angle of rotation on the wafer and recording the data in the database of computer arrangement 60. At 56, an incoming angle of rotation is defined for the wafer and this data is recorded at 60. The wafer now arrives at a first processing stage at 58. As the wafer is moved into the first processing stage, the action of picking up the wafer and placing it in the processing stage imparts a translation angle. The translation angle is then defined at 62 and recorded at 60. Once the processing at the first stage is complete, a mechanical arm or rotating table rotates the wafer to give it an outgoing angle of rotation at 64. The wafer then exits the first stage at 66 and continues to the second stage; the wafer location and rotation angle being recorded at 60. The flow repeats itself at 56 as the wafer is identified and the incoming angle of rotation of the wafer is determined and recorded. The flow is equally applicable to other items such as flat panel displays. An additional step in the flow can include an angle verification step to ensure that the wafers are at the angle of rotation that was originally intended.

In some parts of the processing system, it is advantageous to stop rotating the wafers, such as in the photolithography area, due to alignment issues. However, upon completion the wafers can be returned to the angle of rotation that they had prior to arriving to the photolithography area and then moved on to the next processing stage. In a related embodiment, a control system is included that captures wafer-processing data from prior production runs. The control system data is then shared with the computer arrangement of the rotation system and used to make adjustments up and down the line to improve processing of wafers. For instance, the angles of rotation that are being imparted on the wafers can change due to some change in conditions on the line. The change can be externally or internally driven, but now is manageable with a feedback control loop that is integrated into the processing system.

As noted above, the present invention is applicable to a number of techniques for rotating and tracking material that is being processed in a manufacturing plant. Accordingly, the present invention is not be necessarily limited to the particular examples described above, but is intended to cover all aspects of the invention as fairly set out in the attached claims. For instance, while the rotation and tracking of wafers in a semiconductor facility is illustrated, other positional adjustments may be made to various objects during processing. These adjustments can lead to improvements in the product, in the manufacturing process or in the yield of product. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. An apparatus for rotating wafers in a multiple stage wafer processing system, the apparatus comprising:
   a rotating device that randomly rotates a wafer axially to an incoming angle of rotation as the wafer is presented to a first stage of wafer processing and transmits the rotation angle data;
   a scanning device adapted to determine angles of rotation as the wafer is moving through the first stage and a second stage of wafer processing; and
   a computer arrangement, responsive to the transmitted rotation angle data, for recording the angle of rotation of the wafer and a corresponding wafer location as the wafer moves through the first and second stages of wafer processing.

2. An apparatus for rotating wafers in a multiple stage wafer processing system, the apparatus comprising:
   a rotating device that rotates a wafer to an incoming angle of rotation as the wafer is presented to a first stage of wafer processing and adapted to impart a translation angle and an outgoing angle of rotation on the wafer;
   a scanning device adapted to determine angles of rotation as the wafer is moving through the first stage and a second stage of wafer processing; and
   a computer arrangement for recording the angle of rotation of the wafer and a corresponding wafer location as the wafer moves through the first and second stages of wafer processing.

3. An apparatus for rotating wafers in a multiple stage wafer processing system, the apparatus comprising:
   a sorting apparatus for identifying a wafer and placing the wafer in a carrier slot with an initial incoming angle of rotation and adapted to place multiple sets of wafers in the carrier and arrange each set of wafers within the carrier in a different rotation angle with respect to the adjacent set of wafers;

a rotating device that rotates a wafer to another incoming angle of rotation as the wafer is presented to a first stare of wafer processing;

a scanning device adapted to determine angles of rotation as the wafer is moving through the first stage and a second stage of wafer processing; and a computer arrangement for recording the angles of rotation of the wafer and a corresponding wafer location as the wafer moves through the first and second stages of wafer processing.

4. An apparatus for rotating wafers in a multiple stage wafer processing system, the apparatus comprising:

a sorting apparatus for identifying a wafer and placing the wafer in a carrier slot with an initial incoming angle of rotation and adapted to arrange all of the wafers in the carrier such that each of the wafers has a distinct angle of rotation from any other wafer in the carrier;

a rotating device that rotates a wafer to another incoming angle of rotation as the wafer is presented to a first stage of wafer processing;

a scanning device adapted to determine angles of rotation as the wafer is moving through the first stage and a second stage of wafer processing; and a computer arrangement for recording the angles of rotation of the wafer and a corresponding wafer location as the wafer moves through the first and second stages of wafer processing.

5. The apparatus of claim 4, wherein the sorting apparatus is adapted to verify that all of the wafers have a distinct angle of rotation before processing starts.

6. An apparatus for rotating wafers in a multiple stage wafer processing, system, the apparatus comprising:

a computer arrangement adapted to record wafer-processing data;

a sorting apparatus for identifying a wafer, randomly rotating the wafer axially, placing the wafer in a carrier slot with an initial incoming angle of rotation, and transmitting the rotation angle data to the computer arrangement for recording, the carrier slot and the initial rotation angle;

a rotating device that rotates the wafer to an another incoming angle of rotation as the wafer is presented to a first stage of wafer processing;

a scanning device adapted to determine angles of rotation as the wafer is moving through the first stage and a second state of wafer processing; and the computer arrangement further recording the angles of rotation of the wafer and a corresponding wafer location as the wafer moves through the first and second stages of wafer processing.

7. An apparatus for rotating wafers in a multiple stage wafer processing system, the apparatus comprising:

a rotating device that rotates a wafer to an incoming angle of rotation as the wafer is presented to a first stage of wafer processing and adapted to rotate the wafer axially to the exclusion of certain areas on the wafer;

a scanning device adapted to determine angles of rotation as the wafer is moving through the first stage and a second stage of wafer processing; and a computer arrangement for recording the angle of rotation of the wafer and a corresponding wafer location as the wafer moves through the first and second stages of wafer processing.

8. An apparatus for rotating wafers in a multiple stage wafer processing system, the apparatus comprising:

a rotating device that rotates a wafer to an incoming angle of rotation as the wafer is presented to a first stage of wafer processing and adapted to rotate the wafer axially to the exclusion of a certain processing step in the system;

a scanning device adapted to determine angles of rotation as the wafer is moving through the first stare and a second stage of wafer processing; and a computer arrangement for recording the angle of rotation of the wafer and a corresponding wafer location as the wafer moves through the first and second stages of wafer processing.

9. A system for rotating and tracking wafers in a multiple stage wafer processing system, the system comprising:

a sorting apparatus that identifies a wafer and places the wafer in a carrier slot;

a rotating apparatus that rotates the wafer to an incoming angle of rotation as the wafer is presented to a first processing stage of wafer processing including:

a rotating device adapted to rotate the wafer to an outgoing and a translation angle of rotation; and a scanning device adapted to determine a plurality of angles of rotation as the wafer is moving through the first stage and a second stage of wafer processing; and a computer arrangement adapted to record and track as data the angle of rotation and the corresponding location of the water in the wafer processing system as the wafer moves through separate stages of wafer processing.

10. A system for rotating and tracking wafers in a multiple stage wafer processing system, the system comprising:

a sorting apparatus that identifies a wafer and places the wafer in a carrier slot;

a rotating apparatus that rotates the wafer to an incoming angle of rotation as the wafer is presented to a first processing stage of wafer processing;

a wafer carrier movement detector for determining a rate of rotation of the carrier moving through the wafer processing system; and a computer arrangement adapted to record and track as data the angle of rotation and the corresponding location of the wafer in the wafer processing system as the wafer moves through separate stages of wafer processing.

* * * * *

UNITED STATES PATENT AND TRADEMARK OFFICE
CERTIFICATE OF CORRECTION

PATENT NO.     : 6,699,004 B1
DATED          : March 2, 2004
INVENTOR(S)    : Conboy et al.

It is certified that error appears in the above-identified patent and that said Letters Patent is hereby corrected as shown below:

<u>Column 9,</u>
Line 6, "stare" should read -- stage --.
Line 52, "state" should read -- stage --.

<u>Column 10,</u>
Line 19, "stare" should read -- stage --.

Signed and Sealed this

Fifteenth Day of June, 2004

JON W. DUDAS
*Acting Director of the United States Patent and Trademark Office*